United States Patent
Liu et al.

(10) Patent No.: US 11,929,756 B2
(45) Date of Patent: Mar. 12, 2024

(54) SYSTEM AND METHOD FOR OFFSET CALIBRATION IN A SUCCESSIVE APPROXIMATION ANALOG TO DIGITAL CONVERTER

(71) Applicant: AVAGO TECHNOLOGIES INTERNATIONAL SALES PTE. LIMITED, Singapore (SG)

(72) Inventors: Yong Liu, Irvine, CA (US); Jun Cao, Irvine, CA (US); Delong Cui, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 145 days.

(21) Appl. No.: 17/694,225

(22) Filed: Mar. 14, 2022

(65) Prior Publication Data
US 2023/0291411 A1    Sep. 14, 2023

(51) Int. Cl.
*H03M 1/10*    (2006.01)
*H03M 1/12*    (2006.01)
*H03M 1/46*    (2006.01)

(52) U.S. Cl.
CPC ........ *H03M 1/1028* (2013.01); *H03M 1/1009* (2013.01); *H03M 1/1245* (2013.01); *H03M 1/46* (2013.01)

(58) Field of Classification Search
CPC .... H03M 1/1028; H03M 1/46; H03M 1/1245; H03M 1/1009
See application file for complete search history.

(56) References Cited

U.S. PATENT DOCUMENTS

| | | |
|---|---|---|
| 5,589,832 A | 12/1996 | Grundvig et al. |
| 6,144,331 A | 11/2000 | Jiang |
| 9,485,039 B1 | 11/2016 | Malkin et al. |
| 10,116,318 B1 | 10/2018 | Sharif et al. |
| 10,128,867 B1 | 11/2018 | Van Elzakker |
| 10,348,322 B1 | 7/2019 | Jeong et al. |
| 10,637,493 B1 | 4/2020 | Geddada et al. |
| 10,693,486 B1 | 6/2020 | Ko |
| 10,812,098 B1 | 10/2020 | Vishweshwara et al. |
| 10,886,937 B1 | 1/2021 | Bandyopadhyay et al. |
| 10,903,846 B1 | 1/2021 | Liu et al. |
| 11,043,958 B2 | 6/2021 | Lin et al. |

(Continued)

OTHER PUBLICATIONS

Tomohiko Ogawa, et al., "Non-binary SAR ADC with Digital Error Correction for Low Power Applications," 2010 IEEE Asia Pacific Conference on Circuits and Systems, pp. 196-199, Dec. 2010.

(Continued)

*Primary Examiner* — Joseph J Lauture
(74) *Attorney, Agent, or Firm* — Foley & Lardner LLP

(57) ABSTRACT

Disclosed herein are related to systems and methods for a successive approximation analog to digital converter (SAR ADC). In one aspect, the SAR ADC includes a calibration circuit configured to receive some or all of the plurality of bits corresponding to the input voltage and accumulates or averages at least some of the bits corresponding to the input voltage. The calibration circuit is configured to provide a first offset signal to control a first offset associated with a first comparator, a second offset signal to control a second offset associated with a second comparator, or reduce an offset difference associated with the first offset and the second offset.

20 Claims, 10 Drawing Sheets

(56) References Cited

U.S. PATENT DOCUMENTS

| | | |
|---|---|---|
| 11,387,838 B1 | 7/2022 | Dyer et al. |
| 11,476,868 B2 | 10/2022 | Tangirala |
| 2011/0018605 A1 | 1/2011 | Cho et al. |
| 2013/0051501 A1 | 2/2013 | Furuta |
| 2014/0022105 A1 | 1/2014 | Chen et al. |
| 2015/0091746 A1 | 4/2015 | Wang |
| 2016/0094239 A1 | 3/2016 | Fujiwara et al. |
| 2017/0201268 A1* | 7/2017 | Sharma ............... H03M 1/1245 |
| 2017/0359081 A1 | 12/2017 | Chen et al. |
| 2019/0074845 A1 | 3/2019 | Nakamura et al. |
| 2019/0131997 A1 | 5/2019 | Liu et al. |
| 2019/0166325 A1 | 5/2019 | Kim |
| 2023/0026315 A1 | 1/2023 | Shrivastava |

OTHER PUBLICATIONS

Vito Giannini, "An 820uW 9b 40MS/s Noise-Tolerant Dynamic-SAR ADC in 90nm Digital CMOS," IEEE Solid-State Circuits Conference, pp. 237-238, 2008.

Non-Final Office Action on U.S. Appl. No. 17/700,166 dated Jun. 15, 2023.

\* cited by examiner

SYSTEM AND METHOD FOR OFFSET CALIBRATION IN A SUCCESSIVE APPROXIMATION ANALOG TO DIGITAL CONVERTER

FIELD OF THE DISCLOSURE

This disclosure generally relates to a communication system, including but not limited to a successive approximation analog to digital converter (SAR ADC).

BACKGROUND OF THE DISCLOSURE

Recent developments in communication and computing devices demand high data rates. For example, network switches, routers, hubs or any communication devices may exchange data at a high speed (e.g., 1 Mbps to 100 Gbps) to stream data in real time or process a large amount of data in a seamless manner. To process data efficiently in the digital domain, an amplitude or a voltage of a signal may represent multiple bits, and the signal may be exchanged between two or more communication devices through a cable or a wireless medium. For example, 1.2 V of a signal may represent [00010110], and 1.3 V of the signal may represent [00011001]. To convert a voltage of an input signal into corresponding bits, some communication devices implement a SAR ADC. For example, the SAR ADC may determine a plurality of bits corresponding to the input signal through successive approximation. Dynamic and static offset errors in a comparator of a SAR ADC can affect the precision and/or accuracy of the conversion. ADC offset error can be defined as the deviation of the actual transfer function from the ideal transfer function.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1A:
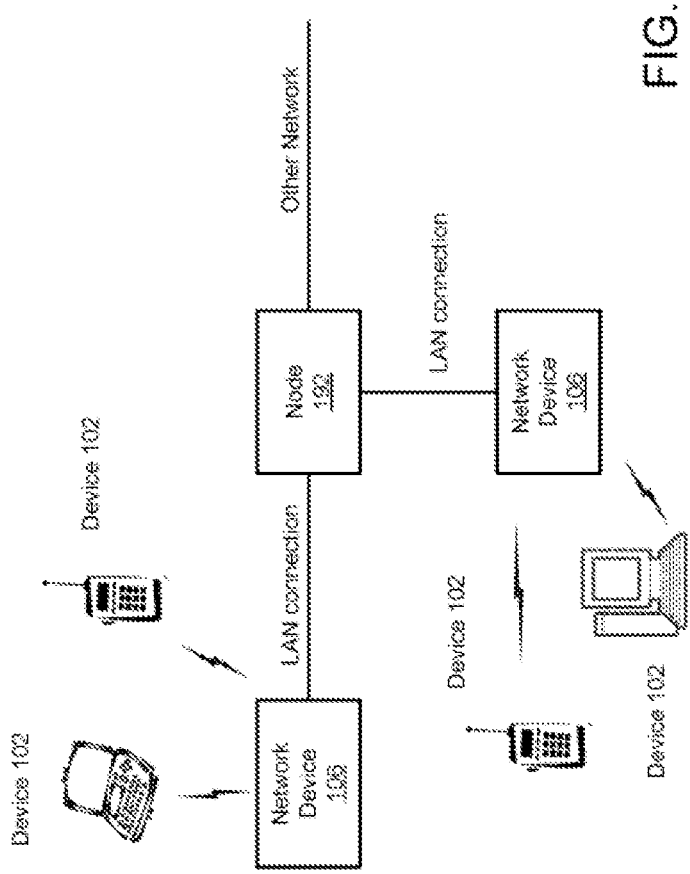
FIG. 1A is a block diagram depicting a network environment including one or more access points in communication with one or more devices or stations, according to one or more embodiments.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems and methods for achieving SAR ADCs (e.g., power efficient SAR ADCs), according to one or more embodiments.

Various embodiments disclosed herein are related to a device for communicating data. In some embodiments, the device includes or is a SAR ADC employed in a physical layer product. In some embodiments, the SAR ADC is a high speed (e.g., above 5 mega samples per second with resolutions from 8 to 18 bits or above 500 Megahertz (e.g., above 1 Gigahertz) operating frequency). In some embodiments, the SAR ADC is used in data communication and processing systems, including but not limited to networking switches, serializer/deserializer (SERDES) physical layer devices (PHYs), optical receivers, wireless receivers (including 5G cellular receivers), data acquisition systems, sensors, etc. The SAR ADC uses offset calibration for two or more comparators where compensation is provided for static and dynamic direct current (DC) offset errors which degrade the SAR ADC performance, especially in time-interleaved ADCs according to some embodiments. Advantageously, systems and methods described herein can provide a SAR ADC that has reduced latency, reduced area, reduced mismatches, increased resolution, and increased bandwidth for large SAR ADC arrays.

Various embodiments disclosed herein are related to a device for communication of data. In some embodiments, the device includes a sample and digital to analog conversion (DAC) circuit to sample an input voltage to obtain a first sampled voltage. In some embodiments, the device includes a first comparator coupled to the sample and DAC circuit. In some embodiments, the device includes a first set of storage circuits coupled to the first comparator and the sample and DAC circuit. In some embodiments, the first set of storage circuits is configured to store states of a first subset of a plurality of bits corresponding to an input voltage. In some embodiments, the device includes a second comparator coupled to the sample and DAC circuit. In some embodiments, the device includes a second set of storage circuits coupled to the second comparator and the sample and DAC circuit. In some embodiments, the second set of storage circuits is configured to store states of a second subset of the plurality of bits corresponding to the input voltage. In some embodiments, the device includes a control circuit coupled to the first comparator and the second comparator. The control circuit may be configured to select, during a first time period for a target bit of the plurality of bits corresponding to the input voltage, the first comparator to determine a state of the target bit. The first comparator may determine the state of the target bit according to the first sampled voltage.

The systems and methods employ a DC offset calibration approach so that offsets of the first comparator and the second comparator are reduced and the residual offsets are small. In some embodiments, the smaller residual offsets improve the SAR ADC effective number of bits (ENOB) and SAR ADC over-range protection margin. In some embodiments, the systems and methods provide more design freedom for optimizing performance, power and speed of the first comparator and the second comparator. In some embodiments, the DC offset calibration approach provides a universal solution for different non-binary SAR DAC weight schemes (e.g., any type of non-binary SAR DAC weight scheme). In some embodiments, the systems and methods provide a time-interleaved SAR ADC based receiver that can be manufactured with a greater yield and that is more robust with more consistent ENOB performance over process, voltage, and temperature (PVT) corners.

Various embodiments disclosed herein are related to a device. The device includes a sample and digital to analog conversion (DAC) circuit to sample an input voltage to obtain a first sampled voltage, a first comparator coupled to the sample and DAC circuit, a first set of storage circuits, a second set of storage circuits, a second comparator and calibration circuit. The first set of storage circuits is coupled to the first comparator and the sample and DAC circuit. The first set of storage circuits is configured to store a first subset of bits corresponding to the input voltage. The second comparator is coupled to the sample and DAC circuit. The second set of storage circuits is coupled to the second comparator and the sample and DAC circuit and is configured to store a second subset of the bits corresponding to the input voltage. The calibration circuit is configured to receive a first bit from a first storage unit of the first set of storage circuits and a number of bits from the first set of storage circuits and the second set of storage circuits. The calibration circuit is configured to provide a first offset signal to control a first offset associated with the first comparator and a second offset signal to control a second offset associated with the second comparator.

In some embodiments, the first comparator has a faster detection speed than the second comparator, and the second comparator has a higher sensitivity than the first comparator. In some embodiments, the first bit is a most significant bit. In some embodiments, the number of bits includes all of the bits of the first set of storage circuits and the second set of storage circuits.

In some embodiments, the calibration circuit includes a first averaging circuit configured to receive the first bit and a second averaging circuit configured to receive the number of bits. In some embodiments, a first offset code calculation circuit is coupled to the first averaging circuit, and a second offset code calculation circuit is coupled to the second averaging circuit. In some embodiments, the first averaging circuit is an accumulator. An accumulator can be a digital logic device including a register for storing arithmetic results, such as, addition, averaging, etc.

In some embodiments, the device is disposed in an integrated circuit package. In some embodiments, an output of the first comparator is directly coupled to input ports of the first set of storage circuits, and an output of the second comparator is directly coupled to input ports of the second set of storage circuits.

Various embodiments disclosed herein are related to a device. The device includes a sample and digital to analog conversion (DAC) circuit to sample an input voltage to obtain a first sampled voltage, a first comparator coupled to the sample and DAC circuit, a first set of storage circuits coupled to the first comparator and the sample and DAC circuit, a second comparator coupled to the sample and DAC circuit, a second set of storage circuits coupled to the second comparator and the sample and DAC circuit, and a calibration circuit. The first set of storage circuits is configured to store a first subset of bits corresponding to the input voltage, and the second set of storage circuits to store a second subset of the bits corresponding to the input voltage. The calibration circuit is configured to receive the second subset of the bits corresponding to the input voltage and accumulates or averages the second subset of the bits corresponding to the input voltage. The calibration circuit is configured to provide a first offset signal to control a first offset associated with the first comparator or a second offset signal to control a second offset associated with the second comparator. The calibration circuit updates the first offset signal or second offset signal when an average of the second subset of the bits is above a threshold.

In some embodiments, the first comparator has a faster detection speed than the second comparator, and the second comparator has a higher sensitivity than the first comparator. In some embodiments, the calibration circuit includes a third comparator, the third comparator receiving the average and the threshold. In some embodiments, the second subset of bits includes all of the bits of the second set of storage circuits. In some embodiments, the calibration circuit includes an adder. In some embodiments, the device is disposed in an integrated circuit package.

Various embodiments disclosed herein are related to a method. The method includes sampling, by a sample and digital to analog conversion (DAC) circuit, an input voltage to obtain a first sampled voltage, and determining, by a first comparator coupled to a first set of storage circuits, a state of a first bit of a plurality of bits corresponding to the input voltage, according to the first sampled voltage. The method also includes sampling, by the sample and DAC circuit, the input voltage to obtain a second sampled voltage, and determining, by a second comparator coupled to a second set of storage circuits different from the first set of storage circuits, a state of a second bit of the plurality of bits, according to the second sampled voltage. The method also includes averaging a first number of the plurality of bits from the first set of storage circuits and a second number of bits from the first set of storage circuits and the second set of storage circuits. The method also includes providing a first offset signal in response to an average of the first number of the bits to control a first offset associated with the first comparator and a second offset signal in response to the second number of bits to control a second offset associated with the second comparator.

In some embodiments, the first number of the bits is a most significant bit. In some embodiments, the second number of the bits includes all of the bits of the first set of storage circuits and the second set of storage circuits. In some embodiments, the method further includes storing, by a corresponding one of the first set of storage circuits, a determined state of the first bit, and storing, by a corresponding one of the second set of storage circuits, a determined state of the second bit. In some embodiments, the sampling, by the sample and DAC circuit, the input voltage to obtain the second sampled voltage operation is based at least in part on the determined state of the first bit stored by the corresponding one of the first set of storage circuits.

A. Computing and Network Environment

Prior to discussing specific embodiments of the present solution, it can be helpful to describe aspects of the operating environment as well as associated system components (e.g., hardware elements) in connection with the methods and systems described herein. Referring to FIG. 1A, an embodiment of a network environment is depicted. In brief overview, the network environment includes a wireless communication system that includes one or more network devices or access points (APs) 106, one or more wireless communication devices 102 and a node or network hardware component 192. The wireless communication devices 102 can for example include computers 102 (e.g., desk top, lap top, notebook, or tablet) personal computers 102 and/or cellular telephone devices 102. The details of an embodiment of each wireless communication device 102 and/or network device 106 are described in greater detail with reference to FIGS. 1B and 1C. The network environment can be an ad hoc network environment, an infrastructure wireless network environment, a subnet environment, etc. in one embodiment. The network devices 106 can be operably coupled to the network hardware or node 192 via local area network connections. The network hardware or node 192, which can include a router, gateway, switch, bridge, modem, system controller, appliance, etc., can provide a local area network connection for the communication system. Each of the network devices 106 can have an associated antenna or an antenna array to communicate with the wireless communication devices in its area. The wireless communication devices 102 can register with a particular AP or network device 106 to receive services from the communication system (e.g., via a SU-MIMO or MU-MIMO configuration). For direct connections (e.g., point-to-point communications), some wireless communication devices can communicate directly via an allocated channel and communications protocol. Some of the wireless communication devices 102 can be mobile or relatively static with respect to AP or network device 106.

In some embodiments an AP or network device 106 includes a device or module (including a combination of hardware and software) that allows wireless communication devices 102 to connect to a wired network using wireless-fidelity (WiFi), or other standards. A network device 106 can sometimes be referred to as a wireless access point (WAP). An network device 106 can be implemented (e.g., configured, designed and/or built) for operating in a wireless local area network (WLAN). An AP or network device 106 can connect to a router (e.g., via a wired network) as a stand-alone device in some embodiments. In other embodiments, an AP or network device 106 can be a component of a router. An AP or network device 106 can provide multiple devices access to a network. An AP or network device 106 can, for example, connect to a wired Ethernet connection and provide wireless connections using radio frequency links for other devices 102 to utilize that wired connection. An AP or network device 106 can be implemented to support a standard for sending and receiving data using one or more radio frequencies. Those standards, and the frequencies they use can be defined by the IEEE (e.g., IEEE 802.11 standards). An Ap or network device 106 can be configured and/or used to support public Internet hotspots, and/or on a network to extend the network's Wi-Fi signal range.

In some embodiments, the access points 106 can be used for (e.g., in-home or in-building) wireless networks (e.g., IEEE 802.11, Bluetooth, ZigBee, any other type of radio frequency based network protocol and/or variations thereof). Each of the wireless communication devices 102 can include a built-in radio and/or is coupled to a radio. Such wireless communication devices 102 and/or access points 106 can operate in accordance with the various aspects of the disclosure as presented herein to enhance performance, reduce costs and/or size, and/or enhance broadband applications. Each wireless communication device 102 can have the capacity to function as a client node seeking access to resources (e.g., data, and connection to networked nodes such as servers) via one or more access points 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In some embodiments, different types of data can be transmitted via different protocols. In other embodiments, the same types of data can be transmitted via different protocols.

Figure 1B:
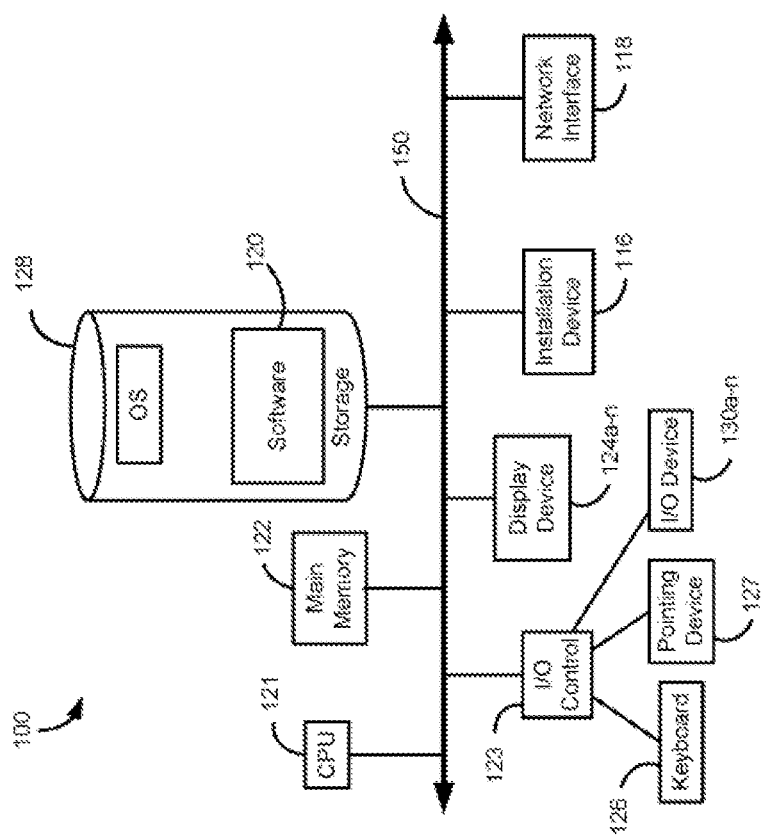
FIGS. 1B and 1C are block diagrams depicting computing devices useful in connection with the methods and systems described herein, according to one or more embodiments.
Figure 1C:
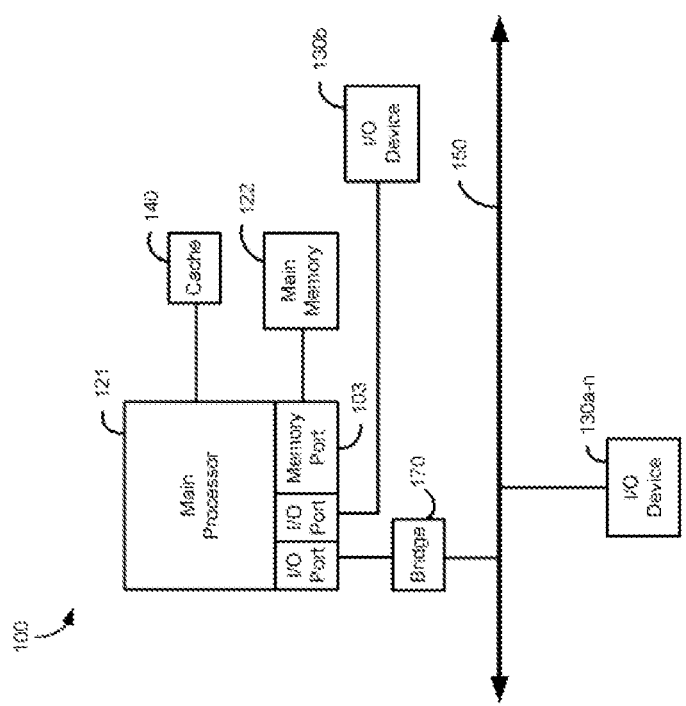

The communications device(s) 102 and access point(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or network device 106. As shown in FIGS. 1B and 1C, each computing device 100 includes a main processor 121, and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include an operating system and/or software. As shown in FIG. 1C, each computing device 100 can also include additional optional elements, such as a memory port 103, a bridge 170, one or more input/output devices 130a-130n, and a cache memory 140 in communication with the main processor 121.

The main processor 121 is any logic circuitry that responds to and processes instructions fetched from the main memory unit 122. In many embodiments, the central processing unit or main processor 121 is provided by a microprocessor unit, such as: those manufactured by Intel Corporation of Santa Clara, California; those manufactured by International Business Machines of White Plains, New York; or those manufactured by Advanced Micro Devices of Sunnyvale, California. The computing device 100 can be based on any of these processors, or any other processor capable of operating as described herein.

Main memory unit 122 can be one or more memory chips capable of storing data and allowing any storage location to be directly accessed by the microprocessor 121, such as any type or variant of Static random access memory (SRAM), Dynamic random access memory (DRAM), Ferroelectric RAM (FRAM), NAND Flash, NOR Flash and Solid State Drives (SSD). The main memory 122 can be based on any of the above described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 can be DRDRAM.

FIG. 1C depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is provided by, for example, SRAM, BSRAM, or EDRAM. In the embodiment shown in FIG. 1C, the processor 121 communicates with various I/O devices 130 via a local system bus 150. Various buses can be used to connect the main processor 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 can use an Advanced Graphics Port (AGP) to communicate with the display 124. FIG. 1C depicts an embodiment of a computer 100 in which the main processor 121 can communicate directly with I/O device 130b, for example via HYPERTRANSPORT, RAPIDIO, or INFINI-BAND communications technology. FIG. 1C also depicts an embodiment in which local busses and direct communication are mixed: the processor 121 communicates with I/O device 130a using a local interconnect bus while communicating with I/O device 130b directly.

A wide variety of I/O devices 130a-130n can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, California.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., configured and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to the network 104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 can include or be connected to one or more display devices 124a-124n. As such, any of the I/O devices 130a-130n and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In some embodiments, any portion of the operating system of the computing device 100 can be configured for using multiple displays 124a-124n. In further embodiments, an I/O device 130 can be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 100 of the sort depicted in FIGS. 1B and 1C can operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7, 8 and 10, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system 100 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. In some embodiments, the computing device 100 can have different processors, operating systems, and input devices consistent with the device. For example, in one embodiment, the computing device 100 is a smart phone, mobile device, tablet or personal digital assistant. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. SAR ADC

Various embodiments disclosed herein are related to a SAR ADC, such as a high speed SAR ADC or very high speed SAR ADC. In some embodiments, the SAR ADC is relatively immune to PVT variations and is configured for use in 200G/100G networking applications. In some embodiments, the systems and methods described herein are for a SAR ADC used in network integrated circuits (ICs) such as a 225 Gbps PAM4 Optical Transceiver or other transceiver. In some embodiments, the systems and methods described herein provide a speed advantage without a significant power/area penalty. The SAR ADC can be utilized in or communicate with the various components discussed above with reference to FIGS. 1A-C. The SAR ADC can operate according to the principles described herein and use the conversion structure and operation described in U.S. Pat. No. 10,903,846 assigned to the assignee of the present application and incorporated herein by reference in its entirety. SAR ADC 300 is an integrated circuit (IC) device integrated on a single substrate, provided in a multi-chip package, or is part of another IC device in some embodiments.

In some embodiments, the SAR ADC includes a digital to analog conversion (DAC) circuit to sample an input voltage. In some embodiments, the SAR ADC includes a first comparator coupled to the DAC circuit, and a first set of storage circuits coupled between the first comparator and the DAC circuit. In some embodiments, the SAR ADC includes a second comparator coupled to the DAC circuit, and a second set of storage circuits coupled between the second comparator and the DAC circuit. In one aspect, the SAR ADC includes a control circuit configured to select, for each of a number of bits (e.g., N bits, where N is any integer) corresponding to the input voltage, a corresponding comparator from the first comparator and the second comparator to determine a state of the each of the plurality of bits during a corresponding time period.

In some embodiments, a DC offset calibration engine uses different approaches for calibrating the first comparator and the second comparator. In some embodiments, systems and methods utilize a DC offset correction circuit for each comparator to correct each comparators DC offset. The SAR ADC output Dout[N-1:0] is sent to the calibration engine to derive the DC offset for each comparator. Based on the offset information, offset calibration codes for the two comparators are sent to their respective offset correction circuits in to correct individual comparator offsets.

In some embodiments, DC offset calibration for the first comparator uses only the most significant bit (MSB) bit of the output (e.g., Dout[N-1]) of the SAR ADC. In some embodiments, DC offset information for the first comparator is extracted after averaging the most significant bit (MSB) bit of the output (e.g., Dout[N-1]) and an offset code for the first comparator is updated accordingly. In some embodiments, DC offset calibration for the second comparator uses all of the bits of the output (e.g., Dout[N-1:0]) of the SAR ADC. In some embodiments, DC offset information for the second comparator is extracted after averaging all of the bits of the output (e.g., Dout[N-1:0]) and an offset code for the second comparator is updated accordingly.

In some embodiments, DC offset information related to an offset difference between the first comparator and the second comparator can be determined after offset calibration of one or both of the first comparator and the second comparator. The offset difference is extracted by averaging all of the bits of the output from the second comparator (e.g., the least significant bits of Dout[N-1:0] or (Dout[M-1:0])). The offset difference is compared to a threshold and if above the threshold, the offset code for the first comparator and/or the second comparator is updated accordingly.

Advantageously, the disclosed SAR ADC can achieve speed and power efficiencies. In one aspect, the first comparator has a faster detection speed than the second comparator, where the second comparator has a higher sensitivity than the first comparator. Hence, selectively configuring the first comparator and the second comparator allows determining states of different bits of an input voltage to be performed in an efficient manner. For example, a state of a most significant bit (MSB) can be determined by the first comparator in a prompt manner, where a state of a least significant bit (LSB) can be determined by the second comparator with a high sensitivity. In one configuration, output ports of the first comparator and the second comparator are coupled to storage circuits, such that first comparator and the second comparator can store the determined states of bits by the storage circuits. However, a large number of storage circuits (e.g., more than 7) coupled to the first comparator and the second comparator may contribute to a large amount of capacitive load, which may degrade the power efficiency and/or the operation speed of the first comparator and the second comparator. By implementing the first comparator coupled to the first set of storage circuits, and the second comparator coupled to the second set of storage circuits, capacitive loads at output ports of the first comparator and the second comparator can be reduced. Due to the reduced capacitive loads, the first comparator and the second comparator may operate in a prompt and power efficient manner.

Figure 2:
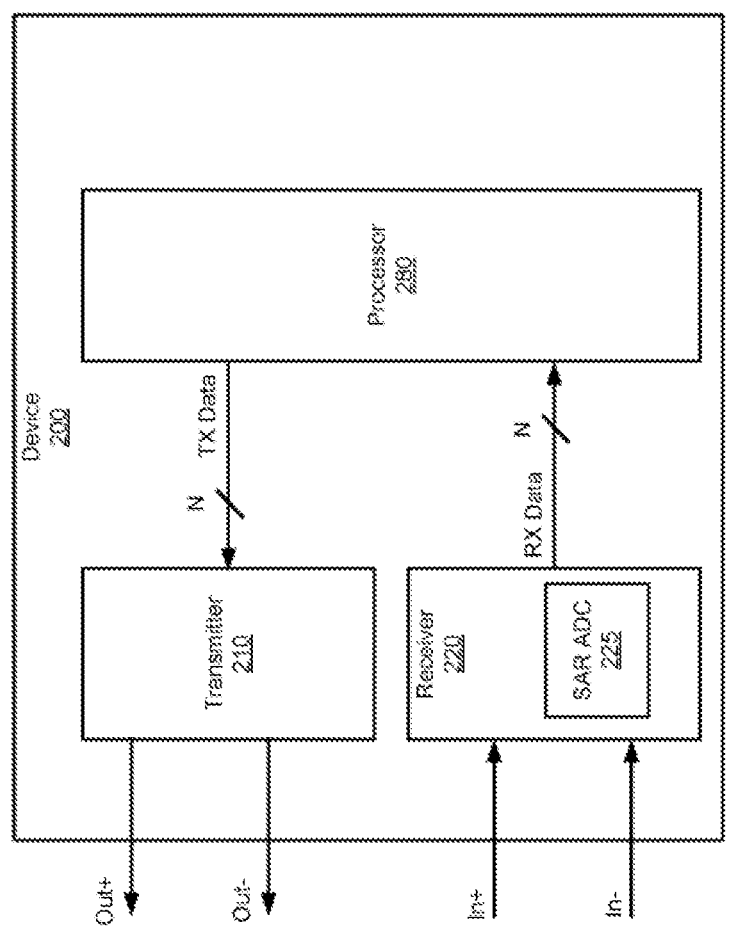
FIG. 2 is a block diagram depicting a communication device, according to one or more embodiments.

FIG. 2 is a block diagram depicting a communication device 200, according to one or more embodiments. In some embodiments, the communication device 200 is a system, a device, or an apparatus (e.g., a 180 giga sample per second optical transceiver) for a network communication. For example, the communication device 200 is implemented as part of the network device 106, the node 192, the device 102 or other part of a network communicating with device 102. In some embodiments, the device 200 includes a transmitter 210, a receiver 220, and a processor 280. These components may operate together to communicate with another communication device through a network cable (e.g., Ethernet, USB, Firewire, etc.) and/or through a wireless medium (e.g., Wi-Fi, Bluetooth, 60 GHz link, cellular network, etc.). In some embodiments, the communication device 200 includes more, fewer, or different components than shown in FIG. 2.

The transmitter 210 is a circuit or a component that receives transmit data TX Data from the processor 280, and generates output signals Out+, Out−. The transmitter 210 may receive N bits of digital data TX Data from the processor 280, and generate the output signals Out+, Out− having voltages or currents corresponding to the digital data TX Data. The output signals Out+, Out− may be differential signals. In some embodiments, the transmitter 210 may generate a single ended signal or a signal in a different representation for the output signals Out+, Out−. In some embodiments, the transmitter 210 transmits the output signals Out+, Out− through a network cable. In some embodiments, the transmitter 210 provides the output signals Out+, Out− to a wireless transmitter (not shown) that can upconvert the output signals Out+, Out− to generate a wireless transmit signal at a radio frequency and transmit the wireless transmit signal through a wireless medium.

The receiver 220 is a circuit or a component that receives input signals In+, In−, and generates receive data RX Data. In some embodiments, the receiver 220 receives the input signals In+, In− through a network cable. The input signals In+, In− may be differential signals. In some embodiments, the receiver 220 may receive a single ended signal or a signal in a different representation for the input signals In+, In−. In some embodiments, the receiver 220 receives the input signals In+, In− from a wireless receiver (not shown) that can receive a wireless receive signal through a wireless medium and downconvert the wireless receive signal to generate the input signals In+, In− at a baseband frequency. In some embodiments, the receiver 220 receives the input signals In+, In− and generates N bits of digital data RX Data corresponding to voltages or currents of the input signals In+, In−. The receiver 220 may provide the digital data RX Data to the processor 280. In some embodiments, the receiver 220 includes a SAR ADC 225 that can convert the input signals In+, In− into N-bit digital data RX Data in a power efficient manner. Detailed description on implementations and operations of the SAR ADC 225 are provided below with respect to FIGS. 3 through 8.

The processor 280 is a circuit or a component that can perform logic computations. In some embodiments, the processor 280 is implemented as a field-programmable gate array, an application-specific integrated circuit, or state machine. The processor 280 may be electrically coupled to the transmitter 210 and the receiver 220 through conductive traces or bus connections. In this configuration, the processor 280 may receive the data RX Data from the receiver 220 and perform logic computations or execute various applications according to states of the received data RX Data. The processor 280 may also generate the data TX Data, and provide the data TX Data to the transmitter 210.

Figure 3:
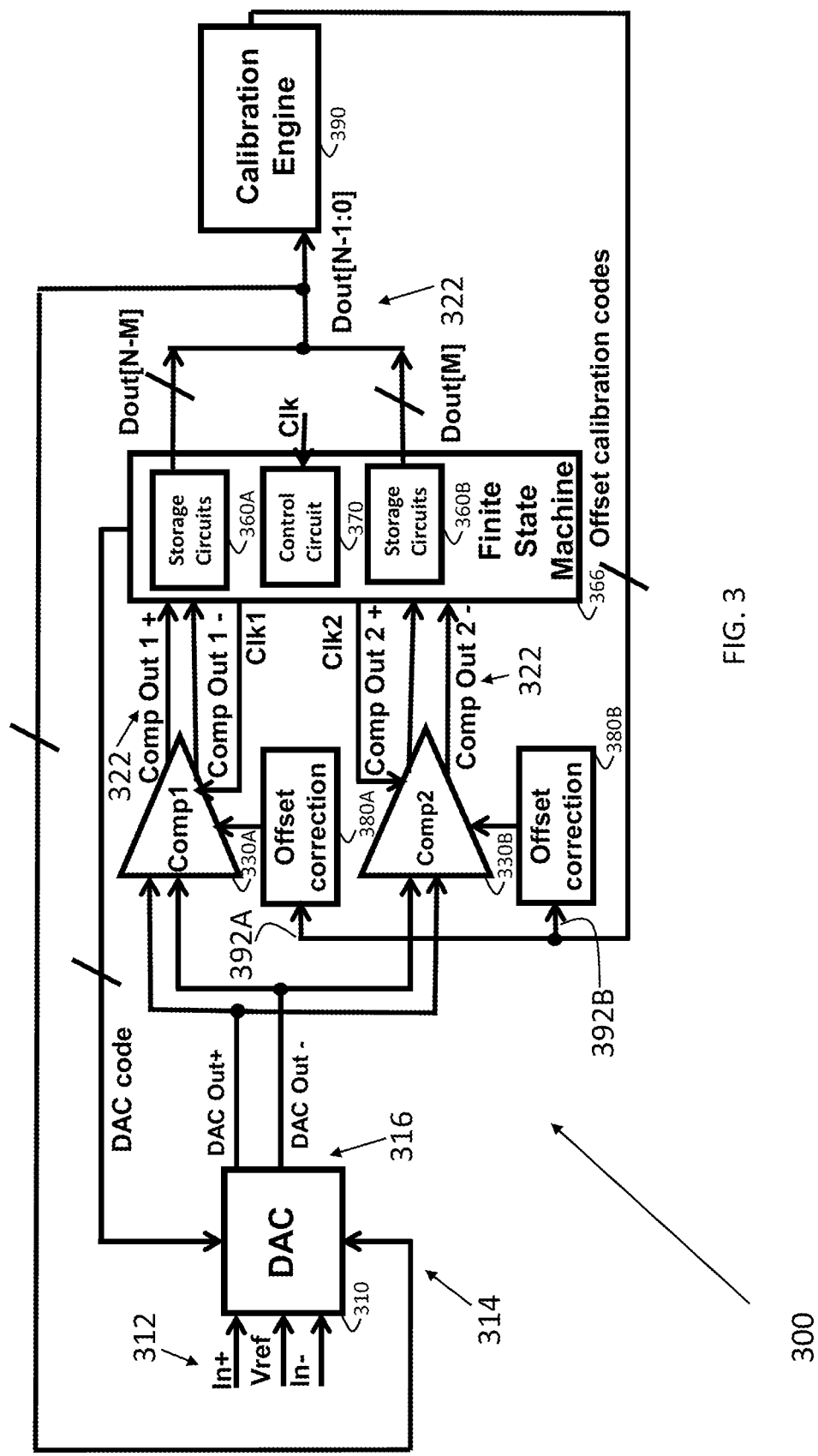
FIG. 3 is a schematic diagram of a SAR ADC, according to one or more embodiments.

FIG. 3 is a block diagram of a SAR ADC 300, according to one or more some embodiments. The SAR ADC 300 may be implemented as the SAR ADC 225 of FIG. 2. In some embodiments, the SAR ADC 300 includes a sample and DAC circuit 310, a comparator 330A, a comparator 330B, a finite state machine 366, an offset correction circuit 380A, an offset correction circuit 380B, and a calibration engine 390. Finite state machine 366 includes a first set of storage circuits 360A, a second set of storage circuits 360B, and a control circuit 370. The components of SAR ADC 300 may operate together to receive input signals In+, In− and perform successive approximation analog to digital conversion to generate N-bit data RX Data corresponding to voltages of the input signals In+, In−. In some embodiments, the SAR ADC 300 includes more, fewer, or different components than shown in FIG. 3. Although in FIG. 3, the sample and DAC circuit 310, the comparators 330A, 330B, and the storage circuits 360A, 360B are shown as generating and processing differential signals, some or all of these components may generate and process single ended signals.

In some embodiments, the sample and DAC circuit 310 is a circuit or a component that samples the input signals In+, In−, and generates DAC output signals DAC Out+, DAC Out−. In one implementation, the sample and DAC circuit 310 is embodied as a capacitive DAC circuit. In some embodiments, the sample and DAC circuit 310 includes input ports 312 to receive the input signals In+, In−, feedback ports 314 to receive N-bit data RX Data, and output ports 316 to output DAC output signals DAC Out+, DAC Out−. In one configuration, N−M number of feedback ports 314 of the sample and DAC circuit 310 are coupled to N−M number of output ports 322 of the first set of storage circuits 360A, and M number of feedback ports 314 of the sample and DAC circuit 310 are coupled to M number of output ports 322 of the second set of storage circuits 360B. In one example, N may be 9 and M may be 4. In some embodiments, N and M can be other integers. In one configuration, a first output port of the sample and DAC circuit 310 is coupled to a first input port of the comparator 330A and a first input port of the comparator 330B. In one configuration, a second output port of the sample and DAC circuit 310 is coupled to a second input port of the comparator 330A and a second input port of the comparator 330B. In this configuration, the sample and DAC circuit 310 receives the input signals In+, In− at the input ports 312 and N-bit data RX Data at the feedback ports 314, and samples the input signals In+, In−. The sample and DAC circuit 310 may perform DAC, according to the N-bit data RX Data to generate DAC output signals DAC Out+, DAC Out− at the output ports 316. The sample and DAC circuit 310 may provide the DAC output signals DAC Out+, DAC Out− to the comparators 330A, 330B. In one approach, for a bit X$^{th}$ of the N− bit data RX Data, the DAC output signals DAC Out+, DAC Out− indicate voltages (e.g., Vin+, Vin−) of the input signals In+, In− with voltages corresponding to N−X number of MSB(s) of Data RX. In one approach, the sample and DAC circuit 310 generates the DAC output signals DAC Out+, DAC Out−, according to the following equation:

$$V_{DAC\ Out+} - V_{DAC\ Out-} = \\ -(V_{in+} - V_{in-}) + \sum_{k=X}^{N} 2^{k-N-1} \times Vref \times (2 * RX\ \text{Data}(k) - 1).$$

In some embodiments, the comparator 330A is a circuit or a component that receives the DAC output signals DAC Out+, DAC Out−, and determines a state of a corresponding bit of the data RX Data according to the DAC output signals DAC Out+, DAC Out−. In one configuration, the comparator 330A includes a first input port coupled to the first output port of the sample and DAC circuit 310 to receive the DAC output signal DAC Out+, a second input port coupled to the second output port of the sample and DAC circuit 310 to receive the DAC output signal DAC Out−, a first output port coupled to first input ports of the first set of storage circuits 360A, a second output port coupled to second input ports of the first set of storage circuits 360A, and a clock input port coupled to a first clock output port of the control circuit 370. The first output port of the comparator 330A may be directly coupled to the first input ports of the storage circuits 360A, and the second output port of the comparator 330A may be directly coupled to the second input ports of the storage circuits 360A. Similarly, the first output port of the comparator 330B may be directly coupled to the first input ports of the storage circuits 360B, and the second output port of the comparator 330B may be directly coupled to the second input ports of the storage circuits 360B. In this configuration, the comparator 330A may be enabled or disabled according to the clock signal CLK1 from the control circuit 370. For example, the comparator 330A is enabled, in response to a rising edge or logic state '1' of the clock signal CLK1. For example, the comparator 330A is disabled, in response to a falling edge or logic state '0' of the clock signal CLK1. When the comparator 330A is enabled, the comparator 330A may determine a state of a bit according to the DAC output signals DAC Out+, DAC Out−, and generate comparator outputs Comp Out1+, Comp Out1− at the output ports 322 indicating the determined state of the bit. For example, when the comparator 330A is enabled, in response to a difference in voltages of the DAC output signal DAC Out+, DAC Out− being higher than 0V or a reference voltage the comparator 330A may generate the comparator output Comp Out1+ having a logic state '1' and the comparator output Comp Out1− having a logic state '0'. For example, when the comparator 330A is enabled, in response to a difference in voltages of the DAC output signals DAC Out+, DAC Out− being lower than 0 V or the reference voltage, the comparator 330A may generate the comparator output Comp Out1+ having a logic state '0' and the comparator output Comp Out1− having a logic state '1'. When the comparator 330A is disabled, the comparator 330A may reset the comparator outputs Comp Out1+, Comp Out1− to logic state '0'. The comparator 330A may provide the comparator outputs Comp Out1+, Comp Out1− to the first set of storage circuits 360A. The comparator outputs Comp Out1+, Comp Out1− may be differential signals.

In some embodiments, the comparator 330B is a circuit or a component that receives the DAC output signals DAC Out+, DAC Out−, and determines corresponding bits of the data RX Data according to the DAC output signals DAC Out+, DAC Out−. In some embodiments, the comparator 330A has a higher detection speed and/or is more power efficient than the comparator 330B, where the comparator 330B has a higher sensitivity than the comparator 330A. In one configuration, the comparator 330B includes a first input port coupled to the first output port of the sample and DAC circuit 310 to receive the DAC output signal DAC Out+, a second input port coupled to the second output port of the sample and DAC circuit 310 to receive the DAC output signal DAC Out−, a first output port coupled to first input ports of the second set of storage circuits 360B, a second output port coupled to second input ports of the second set of storage circuits 360B, and a clock input port coupled to a second clock output port of the control circuit 370. The operation of the comparator 330B is similar to the operation of the comparator 330A, except that the comparator 330B is enabled or disabled in response to the clock signal CLK2 instead of the clock signal CLK1, and the comparator 330B provides the comparator outputs Comp Out2+, Comp Out2− to the second set of storage circuits 360B instead of the first set of storage circuits 360A. Thus, detailed description of duplicated portion is omitted herein for the sake of brevity.

In some embodiments, the first set of storage circuits 360A is a set of components that stores N−M bits (e.g., MSBs) of data. In one implementation, the first set of storage circuits 360A is embodied as N−M number of flip flops or latches (e.g., ratioed S R latches). In some embodiments, a first input port of each storage circuit 360A is coupled to the first output port of the comparator 330A, and a second input port of each storage circuit 360A is coupled to the second output port of the comparator 330A. In some embodiments, an enable port of each storage circuit 360A is coupled to a corresponding enable output port of the control circuit 370, and an output port of each storage circuit 360A is coupled to a corresponding feedback port of the sample and DAC circuit 310. In this configuration, each storage circuit 360A may be enabled or disabled according to a corresponding bit of N−M bit enable signal En1. For example, a first storage circuit 360A is enabled, in response to the enable signal EN1 having [00001]; a second storage circuit 360A is enabled, in response to the enable signal EN1 having [00010]; a third storage circuit 360A is enabled, in response to the enable signal EN1 having [00100]; a fourth storage circuit 360A is enabled, in response to the enable signal EN1 having [01000]; and a fifth storage circuit 360A is enabled, in response to the enable signal EN1 having [10000]. For example, all of the first set of storage circuits 360A are disabled, in response to the enable signal EN1 having [00000]. When a storage circuit 360A is enabled, the storage circuit 360A may update a corresponding bit of data RX Data, according to the comparator outputs Comp Out1+, Comp Out1−. For example, if a storage circuit 360A is enabled, in response to the comparator output Comp Out1+ having a logic state '1' and the comparator output Comp Out1− having a logic state '0', the storage circuit 360A may update a corresponding bit of the data RX Data to '1'. For example, if a storage circuit 360A is enabled, in response to the comparator output Comp Out1− having a logic state '1' and the comparator output Comp Out1+ having a logic state '0', the storage circuit 360A may update a corresponding bit of the data RX Data to '0'. If a storage circuit 360A is disabled, the storage circuit 360A may hold or maintain a corresponding bit of the data RX Data (Dout[N−1,0]), irrespective of the comparator outputs Comp Out1+, Comp Out1− at the input ports.

In some embodiments, the second set of storage circuits 360B is a set of components that stores M bits (e.g., LSBs) of data. In one implementation, the second set of storage circuits 360B is embodied as M number of flip flops or latches. In some embodiments, a first input port of each storage circuit 360B is coupled to the first output port of the comparator 330B, and a second input port of each storage circuit 360B is coupled to the second output port of the comparator 330B. In some embodiments, an enable port of each storage circuit 360B is coupled to a corresponding enable output port of the control circuit 370, and an output port of each storage circuit 360B is coupled to a corresponding feedback port of the sample and DAC circuit 310. The operation of the storage circuits 360B is similar to the operation of the first set of storage circuits 360A, except that each of the storage circuits 360B is enabled or disabled in response to a corresponding state of the M bit enable signal En2 instead of the N−M bit enable signal En1, and each of the storage circuits 360B stores and outputs a corresponding bit of M bits (e.g., LSBs or Dout[M−1,0]) of data RX Data (e.g., instead of N−M bits (e.g., MSBs) of data RX Data. Thus, detailed description of the duplicated portion is omitted herein for the sake of brevity.

In some embodiments, the control circuit 370 is a component that configures the comparators 330A, 330B and the storage circuits 360A, 360B to perform successive approximation analog to digital conversion. In one implementation, the control circuit 370 is implemented as a state machine, or as one or more digital logic circuits. In some embodiments, the control circuit 370 includes an input port to receive a clock signal CLK, for example, from a clock generator (not shown), the first clock output port coupled to the clock input port of the comparator 330A, the second clock output port coupled to the clock input port of the comparator 330B, N−M number of enable output ports coupled to enable ports of the first set of storage circuits 360A and M number of enable output ports coupled to enable ports of the second set of storage circuits 360B. In this configuration, the control circuit 370 may generate the clock signal CLK1 at the first clock output port according to the clock signal CLK, and provide the clock signal CLK1 to the first comparator 330A. In addition, the control circuit 370 may generate the clock signal CLK2 at the second clock output port according to the clock signal CLK, and provide the clock signal CLK2 to the second comparator 330B. Moreover, the control circuit 370 may generate the N−M bit enable signal En1 at the N−M number of enable output ports according to the clock signal CLK, and provide the N−M bit enable signal En1 to the first set of storage circuits 360A. Furthermore, the control circuit 370 may generate the M bit enable signal En2 at the M number of enable output ports according to the clock signal CLK, and provide the M bit enable signal En2 to the second set of storage circuits 360B. In some embodiments, one or more of the signals CLK1, CLK2, En1, En2 are generated irrespective of the clock signal CLK, but may be generated according to the comparator outputs Comp Out1+, Comp Out1− and/or the comparator outputs Comp Out1+, Comp Out1−. For example, the signals CLK1, CLK2, En1, En2 may be generated in response to a rising edge of the comparator output Comp Out1+, Comp Out1−, Comp Out2+, Comp Out2−.

In one aspect, the control circuit 370 generates the clock signals CLK1, CLK2, and enable signals En1, En2 to configure the sample and DAC circuit 310, the comparators 330A, 330B, and the storage circuits 360A, 360B to perform successive approximation analog to digital conversion. In one approach, the control circuit 370 may generate the clock signal CLK1 having a train of pulses to select or enable the comparator 330A during a corresponding time period to determine states of N−M bits (e.g., MSBs) of data RX Data, while generating the clock signal CLK2 having a logic state '0' to disable the comparator 330B. When the comparator 330A is enabled, the control circuit 370 may generate the N−M bit enable signal En1 to configure the storage circuits 360A to store the determined states of the N−M bits (e.g., MSBs) of the data RX Data. For example, for the MSB of the data RX Data, the sample and DAC circuit 310 can sample the input signals In+, In− to generate the DAC output signals DAC Out+, DAC Out−. In response to a rising edge or a logic state '1' of the clock signal CLK1, the comparator 330A can generate comparator outputs Comp Out1+, Comp Out1− indicating a state of the MSB, according to the DAC output signals DAC Out+, DAC Out−. Then, in response to a pulse or a logic state '1' of a corresponding bit of the enable signal En1, a corresponding storage circuit 360A may store the state of the MSB of the data RX Data, according to the comparator outputs Comp Out1+, Comp Out1−. For the subsequent bit of the data RX Data, the sample and DAC circuit 310 can sample the input signals In+, In−, according to the state(s) of previous bit(s) of the data RX Data to generate the DAC output signals DAC Out+, DAC Out−. In response to a rising edge or a logic state '1' of the clock signal CLK1, the comparator 330A can generate comparator outputs Comp Out1+, Comp Out1− indicating a state of the subsequent bit, according to the DAC output signals DAC Out+, DAC Out. Then, in response to a pulse or a logic state '1' of a corresponding bit of the enable signal En1, a corresponding storage circuit 360A may store the state of the subsequent bit of the data RX Data, according to the comparator outputs Comp Out1+, Comp Out1−. The process may repeat for remaining bits of N−M bits of data RX Data.

After determining states of N−M bits of data RX Data, the control circuit 370 may generate the clock signal CLK2 having a train of pulses to select or enable the comparator 330B during a corresponding time period to determine states of M bits (e.g., LSBs) of data RX Data, while generating the clock signal CLK1 having a logic state '0' to disable the comparator 330A. When the comparator 330B is enabled, the control circuit 370 may generate the M bit enable signal En2 to configure the storage circuits 360B to store the determined states of the M bits (e.g., LSBs) of the data RX Data. For example, for the Mth bit of the data RX Data, the sample and DAC circuit 310 can sample the input signals In+, In− according to states of previous N−M bits of the data RX Data to generate the DAC output signals DAC Out+, DAC Out−, and the comparator 330B can generate comparator outputs Comp Out2+, Comp Out2− indicating a state of the Mth bit, according to the DAC output signals DAC Out+, DAC Out−. Then, a corresponding storage circuit 360B may store the state of the Mth bit of the data RX Data. For the subsequent bit of the data RX Data, the sample and DAC circuit 310 can sample the input signals In+, In−, according to the states of previous bits of the data RX Data to generate the DAC output signals DAC Out+, DAC Out−. In response to a rising edge or a logic state '1' of the clock signal CLK2, the comparator 330B can generate comparator outputs Comp Out2+, Comp Out2− indicating a state of the subsequent bit, according to the DAC output signals DAC Out+, DAC Out−. Then, in response to a pulse or a logic state '1' of a corresponding bit of the enable signal En2, a corresponding storage circuit 360B may store the state of the subsequent bit of the data RX Data according to the comparator outputs Comp Out2+, Comp Out2−. The process may repeat for remaining bits of M bits of data RX Data.

Advantageously, the SAR ADC 300 can achieve a speed and power efficiency. In one aspect, the comparator 330A has a higher detection speed and/or is more power efficient than the comparator 330B, where the comparator 330B has a higher sensitivity than the comparator 330A. Hence, the comparator 330A may determine states of a first subset of bits (e.g., MSBs) of the data RX Data, where the comparator 330B may determine states of a second subset of bits (e.g., LSBs) of the data RX Data. In one implementation, a multiplexer may be added between output ports of the comparators 330A, 330B and input ports of the storage circuits 360A, 360B, and may electrically couple the comparator 330A or the comparator 330B to the storage circuits 360A, 360B. However, electrically coupling the comparator 330A or the comparator 330B to the storage circuits 360A, 360B may increase capacitive loads at the output ports of the comparators 330A, 330B. Such increased capacitive loads may degrade a speed and power efficiency. By implementing the comparator 330A having output ports directly coupled to input ports of the storage circuits 360A and the comparator 330B having output ports directly coupled to input ports of the storage circuits 360B, capacitive loads at the output ports of the comparators 330A, 330B can be reduced, thereby achieving a speed and power efficiency. A driver can be provided between the comparator 330A and input ports of the storage circuits 360A and the comparator 330B and input ports of the storage circuits 360B.

Offset correction circuits 380A and 380B are configured to provide offset corrections (e.g., to reduce offset errors) for comparators 330A and 330B, respectively. Offset correction circuit 380A corrects a DC offset of comparator 330A, and offset correction circuit 380B corrects a DC offset of comparator 330A in some embodiments. Offset correction circuit 380A receives an offset correction code for comparator 330A from calibration engine 390 at input 392A, and offset correction circuit 380B receives an offset correction code for comparator 330B from calibration engine 390 at input 392B. The offset correction code can correct for offsets caused by input circuits for SAR ADC 300 and/or from comparators 330A and 330B. The use of offset correction circuits 380A and 380B allows different static and dynamic DC offsets for comparators 330A and 330B to be accommodated, thereby reducing degradation of the SAR ADC performance, especially in time-interleaved ADCs. In some embodiments, each of the offset correction circuits 380A and 380B includes one or more analog correction circuits. The analog correction circuits are configured to control one or more programmable capacitors (e.g., a bank of four binary-scaled switchable capacitors) to adjust offset current, voltage or power. In some embodiments, the offset correction circuits 380A and 380B receive a digital offset correction code and include a DAC and a capacitor driven by the DAC. The DAC makes small adjustments to an input of comparators 330A and 330B via the capacitor in response to the digital offset correction code. In some embodiments, each of the offset correction circuits 380A and 380B includes an offset register.

The calibration engine 390 is configured to provide the offset correction code for comparator 330A at input 392A and is configured to provide the offset correction code for comparator 330B at input 392B. The calibration engine 390 determines the offset calibration codes for comparators 330A and 330B in response to the data Dout [N–1,0]. In some embodiments, all output data bits (Dout[N–1,0]) are not used to calibrate comparator 330A because all output data bits (Dout[N–1,0]) indicate at least partially the offset of comparator 330B, not the offset of comparator 330A. In some embodiments, the first N–M bits of Dout[N–1:0] are not used to calibrate comparator 330A where non-binary DAC weights for over-range protection are implemented, thereby improving SAR effective number of bits (ENOB) over issues such as incomplete DAC settling, reference kick, comparator offset mismatch, high noise in the first several bit comparison cycles, etc.

In two comparator SAR ADCs such as SAR ADC 300, over-range protection is very efficient to optimize SAR ADC power, speed and noise performance. A design of comparator 330A with higher speed and lower power over comparator 330B results in higher noise in comparator 330A than comparator 330B. Over-range protection helps reduce the impact of high noise associated with comparator 330A on SAR ADC ENOB in some embodiments. In addition, over-range protection reduces the impact of residual DC offset between comparator 330A and comparator 330B (even after DC offset calibration of comparator 330A and comparator 330B) on SAR ADC ENOB. For some over-range protection schemes, the MSB bit is the sum of the following several bits in a first DAC weight range for comparator 330A. For example, for an 8-bit SAR ADC, one example DAC weight scheme is 120, 64, 32, 16, 8, 8, 4, 2, 1. The first 5 bit weights 120, 64, 32, 16 and 8 are used for comparator 330A and the remaining 4 bit weights 8, 4, 2, and 1 are used for comparator 330B. In this case, for comparator 330A, when the DC offset is small and the noise is reasonably small (the overall error is «8), the first 5 bits are either 10000 or 01111. This means the binary value of the first 5 bits is always 120 and the DC offset of comparator 330A cannot be extracted.

In some embodiments, the offset correction code for comparator 330B is determined using all output data bits (Dout[N–1,0]) and the offset code for comparator 330A is determined using a single output data bit (e.g., the MSB (Dout[N–1]) to allow the DC offset of comparator 330A to be extracted. In some embodiments, the offset correction codes are determined using polarity based offset detection. In some embodiments, the offset correction circuits 380A and 380B and calibration engine 390 can handle scenarios where comparator offsets are large without requiring larger over-range protection. In some embodiments, the offset correction circuits 380A and 380B and calibration engine 390 correct comparator offsets so that bit comparison errors are reduced when the comparator 330B is used right after comparator 330B.

Figure 4:
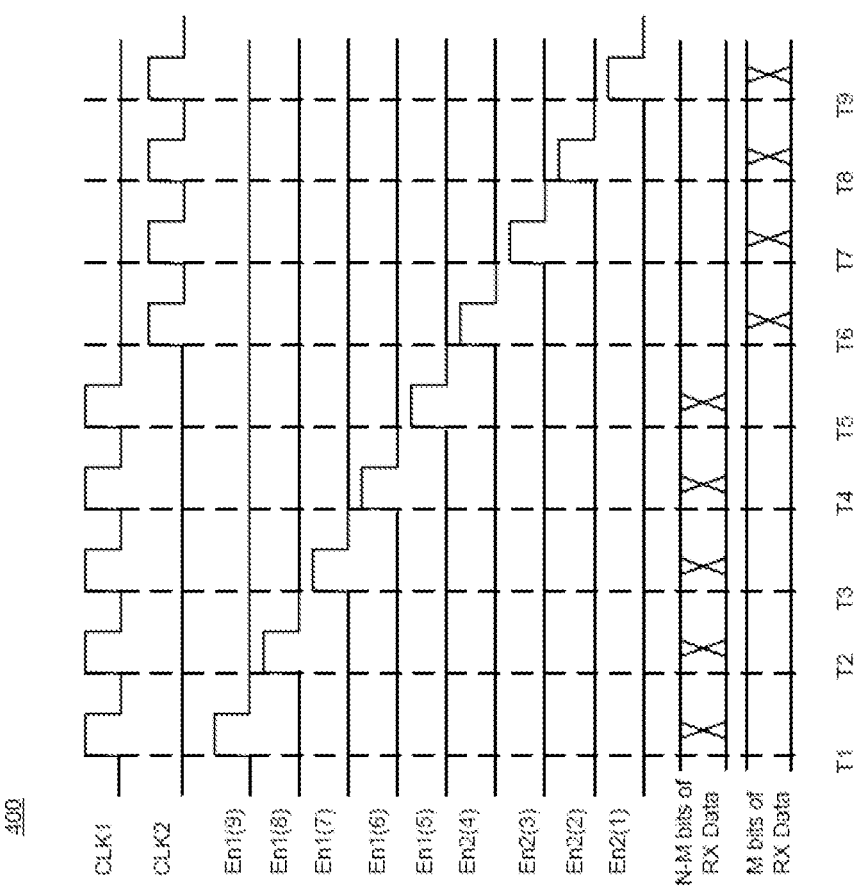
FIG. 4 is a timing diagram for operations of the SAR ADC illustrated in FIG. 3, according to one or more embodiments.

FIG. 4 is a timing diagram 400 showing an operation of the SAR ADC 300 of FIG. 3, according to one or more embodiments. In some embodiments, the control circuit 370 generates the clock signals CLK1, CLK2, and the enable signals En1, En2 to configure the sample and DAC circuit 310, the comparators 330A, 330B, and the storage circuits 360A, 360B to perform successive approximation analog to digital conversion to determine states of N-bit data RX Data. In the example shown in FIG. 4, N is 9 and M is 4. In some embodiments, the principles disclosed herein can be applied to perform successive approximation analog to digital conversion to determine states of a different number of bits of data RX Data. In one approach, the control circuit 370 may generate the clock signal CLK1 having pulses at times T1-T5, and generate the clock signal CLK2 having pulses at times T6-T9. In one aspect, the comparator 330A is enabled in response to the pulses of the clock signal CLK1 at times T1-T5, while the comparator 330B is disabled. In one aspect, the comparator 330B is enabled in response to the pulses of the clock signal CLK2 at times T6-T9, while the comparator 330A is disabled.

In one example, near or before time T1, the sample and DAC circuit 310 can sample the input signals In+, In– to generate the DAC output signals DAC Out+, DAC Out–. After the DAC output signals DAC Out+, DAC Out– settle at time T1, the comparator 330A can generate comparator outputs Comp Out1+, Comp Out1– indicating a state of the first bit (or MSB) of the data RX Data, according to the DAC output signals DAC Out+, DAC Out–. Then, a corresponding storage circuit 360A may store the state of the first bit or MSB of the data RX Data, in response to a logic state '1' of the enable signal En1(9).

In one example, after time T1 and near or before time T2, the sample and DAC circuit 310 can perform DAC according to the state of the first bit of the data RX Data to generate the DAC output signals DAC Out+, DAC Out–. After the DAC output signals DAC Out+, DAC Out– settle at time T2, the comparator 330A can generate comparator outputs Comp Out1+, Comp Out1– indicating a state of the subsequent bit (or the second bit), according to the DAC output signals DAC Out+, DAC Out–. Then, a corresponding storage circuit 360A may store the state of the subsequent bit (or the second bit) of the data RX Data, in response to a logic state '1' of the enable signal En1(8).

In one example, after time T2 and near or before time T3, the sample and DAC circuit 310 can perform DAC, according to the determined states of two bits of the data RX Data to generate the DAC output signals DAC+, DAC–. After the DAC output signals DAC+, DAC– settle at time T3, the comparator 330A can generate comparator outputs Comp Out1+, Comp Out1– indicating a state of the subsequent bit (or the third bit), according to the DAC output signals DAC+, DAC–. Then, a corresponding storage circuit 360A may store the state of the subsequent bit (or the third bit) of the data RX Data, in response to a logic state '1' of the enable signal En1(7).

In one example, after time T3 and near or before time T4, the sample and DAC circuit 310 can perform DAC, according to the determined states of three bits of the data RX Data to generate the DAC output signals DAC+, DAC−. After the DAC output signals DAC+, DAC− settle at time T4, the comparator 330A can generate comparator outputs Comp Out1+, Comp Out1− indicating a state of the subsequent bit (or the fourth bit), according to the DAC output signals DAC+, DAC−. Then, a corresponding storage circuit 360A may store the state of the subsequent bit (or the fourth bit) of the data RX Data, in response to a logic state '1' of the enable signal En1(6).

In one example, after time T4 and near or before time T5, the sample and DAC circuit 310 can perform DAC, according to the determined states of four bits of the data RX Data to generate the DAC output signals DAC+, DAC−. After the DAC output signals DAC+, DAC− settle at time T5, the comparator 330A can generate comparator outputs Comp Out1+, Comp Out1− indicating a state of the subsequent bit (or the fifth bit), according to the DAC output signals DAC+, DAC−. Then, a corresponding storage circuit 360A may store the state of the subsequent bit (or the fifth bit) of the data RX Data, in response to a logic state '1' of the enable signal En1(5).

In one example, after time T5 and near or before time T6, the sample and DAC circuit 310 can perform DAC, according to the determined states of five bits of the data RX Data to generate the DAC output signals DAC+, DAC−. After the DAC output signals DAC+, DAC− settle at time T6, the comparator 330B can generate comparator outputs Comp Out2+, Comp Out2− indicating a state of the subsequent bit (or the sixth bit), according to the DAC output signals DAC+, DAC−. Then, a corresponding storage circuit 360B may store the state of the subsequent bit (or the sixth bit) of the data RX Data, in response to a logic state '1' of the enable signal En2(4).

In one example, after time T6 and near or before time T7, the sample and DAC circuit 310 can perform DAC, according to the determined states of six bits of the data RX Data to generate the DAC output signals DAC+, DAC−. After the DAC output signals DAC+, DAC− settle at time T7, the comparator 330B can generate comparator outputs Comp Out2+, Comp Out2− indicating a state of the subsequent bit (or the seventh bit), according to the DAC output signals DAC+, DAC−. Then, a corresponding storage circuit 360B may store the state of the subsequent bit (or the seventh bit) of the data RX Data, in response to a logic state '1' of the enable signal En2(3).

In one example, after time T7 and near or before time T8, the sample and DAC circuit 310 can perform digital to analog conversion, according to the determined states of seven bits of the data RX Data to generate the DAC output signals DAC+, DAC−. After the DAC output signals DAC+, DAC− settle at time T8, the comparator 330B can generate comparator outputs Comp Out2+, Comp Out2− indicating a state of the subsequent bit (or the eighth bit), according to the DAC output signals DAC+, DAC−. Then, a corresponding storage circuit 360B may store the state of the subsequent bit (or the eighth bit) of the data RX Data, in response to a logic state '1' of the enable signal En2(2).

In one example, after time T8 and near or before time T9, the sample and DAC circuit 310 can perform digital to analog conversion, according to the states of eight bits of the data RX Data to generate the DAC output signals DAC+, DAC−. After the DAC output signals DAC+, DAC− settle at time T9, the comparator 330B can generate comparator outputs Comp Out2+, Comp Out2− indicating a state of the subsequent bit (or the ninth bit), according to the DAC output signals DAC+, DAC−. Then, a corresponding storage circuit 360B may store the state of the subsequent bit (or the ninth bit) of the data RX Data, in response to a logic state '1' of the enable signal En2(1).

Figure 5:
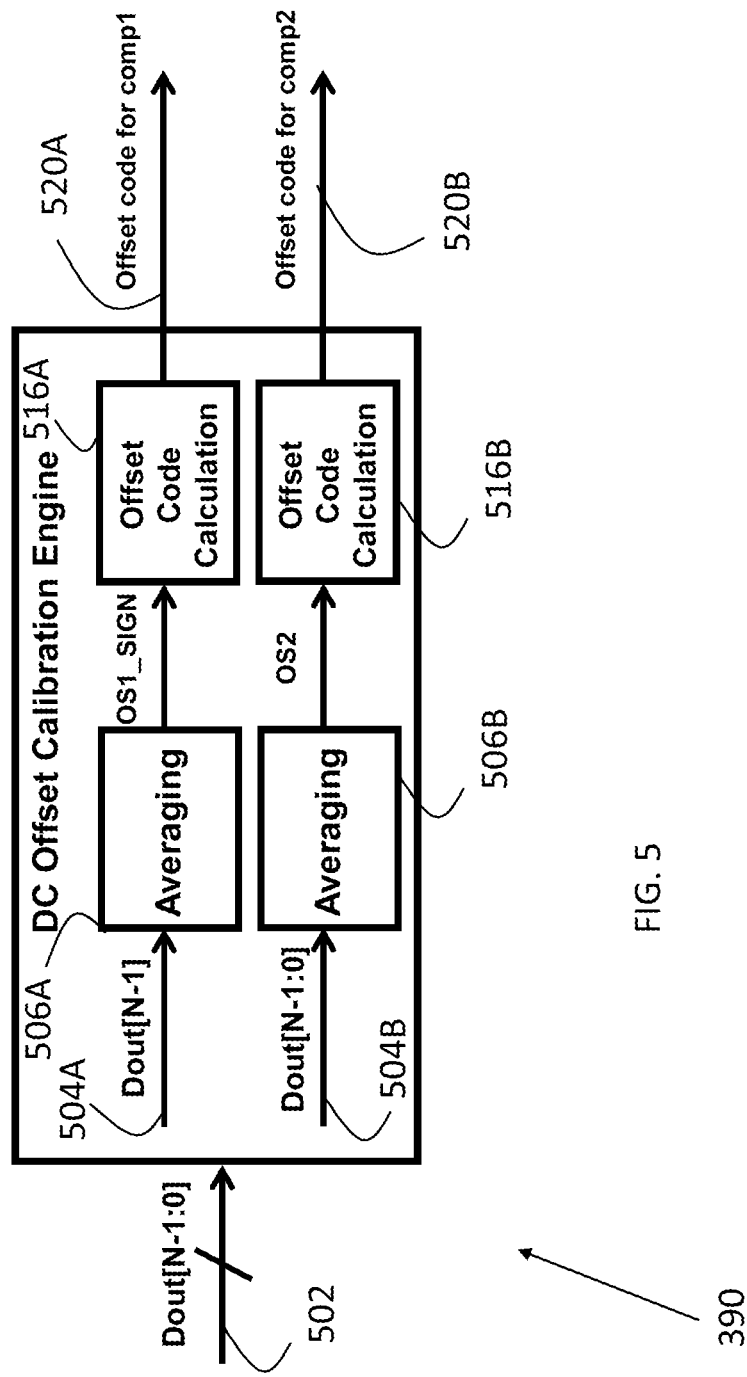
FIG. 5 is a block diagram of a calibration engine for the SAR ADC illustrated in FIG. 3, according to one or more embodiments.

With reference to FIG. 5, calibration engine 390 is configured as a DC offset calibration engine and receives the output data Dout[N−1] at input 502 from output ports 322 (FIG. 3) and provides the offset correction code for comparator 330A at output 520A for reception at input 392A (FIG. 3) of offset correction circuit 380B and the offset correction code for comparator 330B at output 520B for reception at input 392B of offset correction circuit 380B. Values of the output data Dout[N−1] can be provided over a time period where samples at input ports 312 are varied with an average in the middle of the input range of SAR DAC (e.g., 0 V in some embodiments). Calibration engine 390 includes an averaging circuit 506A, an averaging circuit 506B, an offset code calculation circuit 516A, and an offset code calculation circuit 516B. The calibration engine 390 includes an input 504A for output data Dout[N−1] from input 502 and an input 504B for output data Dout[N−1:0] from input 502.

Averaging circuit 506A averages the value of Dout[N−1] over a time period. In some embodiments, the averaging circuit 506A provides a running average. The offset code calculation circuit 516A receives the average of output data Dout[N−1]. The offset code calculation circuit 516A decreases the offset signal (e.g., offset command) for comparator 330A to reduce the DC offset if the average is above a threshold (the expected average, e.g., 0.5) and increases the offset signal (e.g., offset command) to increase the DC offset if the average is below the threshold.

Averaging circuit 506B averages the values of Dout[N−1:0] over a time. In some embodiments, the averaging circuit 506B provides a running average. The offset code calculation circuit 516B receives the average of output data Dout[N−1:0]. The offset code calculation circuit 516B decreases the offset command for comparator 330B to reduce the DC offset if the average is above a threshold (the expected average, e.g., 0.5) and increases the offset command to increase the DC offset if the average is below the threshold.

The averaging circuits 506A and 506B can be any hardware circuit or software process for determining average values. Multipliers, dividers, registers, adders, etc. can be utilized. Similar to averaging circuits 506A and 506B, offset code calculation circuits 516A and 516 B can be any hardware circuit or software process for determining offset codes. Averaging circuits 506A and 506B and offset code calculation circuits 516A and 516B can be integrated with SAR ADC 300 (e.g., provided as part of control circuit 370 or other part or parts of SAR ADC 300). In some embodiments, calibration engine 390 is a processor, a microcontroller (e.g., executing firmware), an ASIC, a field programmable gate array (FPGA) or logic device, or any other type and form of dedicated semiconductor logic or processing circuitry capable of processing or supporting the operations described herein. In some embodiments, operations associated with calibration engine 390 are performed in part by processor 280 (FIG. 2).

Calibration operations as described herein can be performed at device initialization, at power on, and periodically during device operation. In some embodiments, calibration operations can be initiated in response to heat changes, detected errors, etc.

Figure 6:
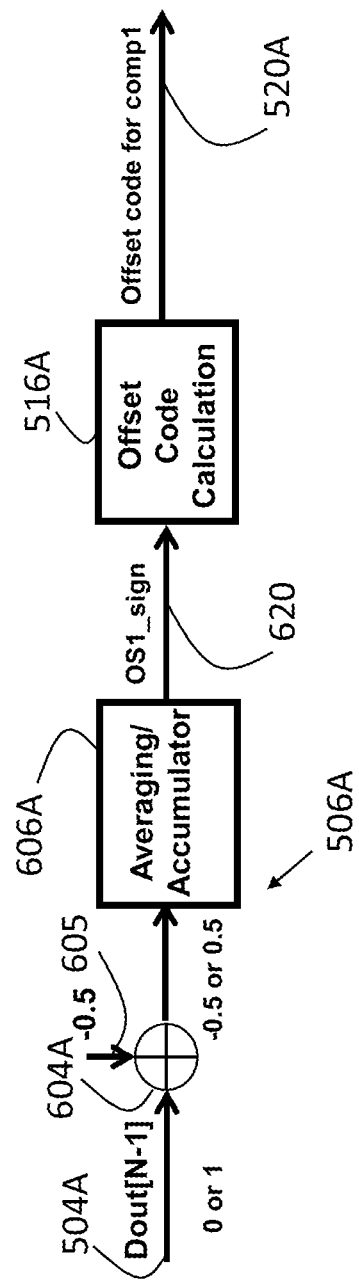
FIG. 6 is a block diagram of a portion of calibration engine illustrated in FIG. 5, according to one or more embodiments.

With reference to FIG. 6, averaging circuit 506A includes an input 504A, an adder 604A, and an accumulator 606A in some embodiments. Accumulator 606A is coupled to offset code calculation circuit 516A. The MSB bit of the data output Dout[N−1] is received as a 0 or 1 value at input 504A. The MSB bit of the data output is subtracted in adder 604A by a value 0.5 provided at an input 605 of adder 604A. The result is a −0.5 or 0.5 value with an average equal to 0. The value Dout[N−1]−0.5 is provided to accumulator 606A (e.g., averaging circuit). For an averaging circuit implementation, Dout[N−1]−0.5 is accumulated for K times (where K is an integer (e.g., 5, 10, 20, 50, 100, etc.)). An average value is calculated as OS1_sign=Σ(Dout[N−1]−0.5)/K at output 620 in some embodiments. For an accumulator operation, Dout[N−1]−0.5 is continuously added and the accumulator output OS1_sign value equals an average value given by Σ(μ*(Dout[N−1]−0.5)), where μ is a coefficient that defines the accumulator bandwidth in some embodiments.

The OS1_sign value at output 620 is used to update offset command for comparator 330A (FIG. 3). When the OS1_sign value is greater than 0, comparator 330A (FIG. 3) has a positive DC offset. Accordingly, the offset signal (e.g., offset command) is updated by offset code calculation circuit 516A to reduce DC offset for comparator 330A. When OS1_sign value is less than 0, the comparator 330A has a negative DC offset. Accordingly, the offset signal (e.g., offset command) is updated by offset code calculation circuit 516A to increase the DC offset for comparator 330A. In some embodiments, adder 604A can be disposed between accumulator 606A and offset code calculation circuit 516A.

Figure 7:
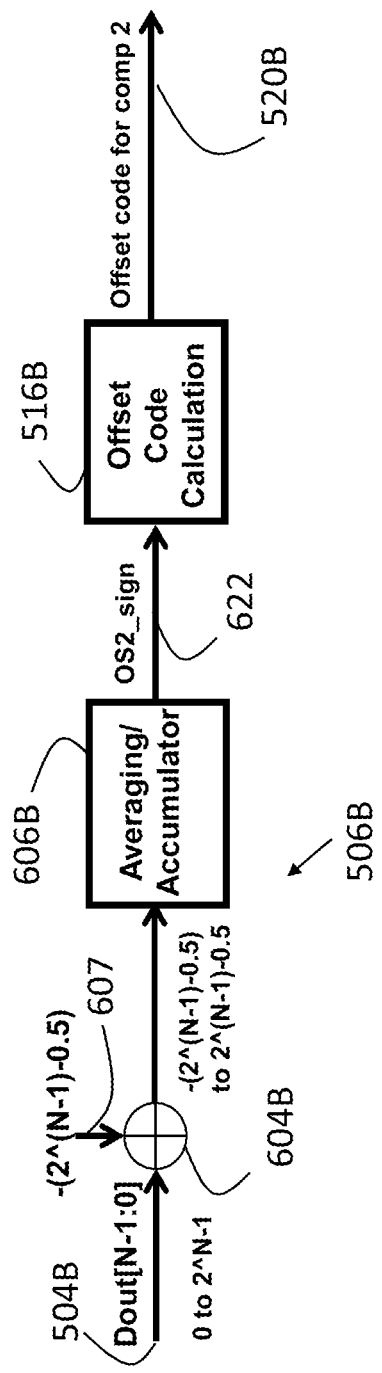
FIG. 7 is a block diagram of a portion of calibration engine illustrated in FIG. 5, according to one or more embodiments.

With reference to FIG. 7, averaging circuit 506B includes an input 504B, an adder 604B, and an accumulator 606B in some embodiments. Accumulator 606B is coupled to offset code calculation circuit 516B. All of the bits of the data output Dout[N−1:0] is received as a value ranging from 0 to $2^{N-1}$ at input 504B. The value of the bits of the data output Dout[N−1:0] is subtracted in adder 604B by a value $2^{(N-1)}-0.5$ provided at input 607 of adder 604B. The result ranges from $-(2^{(N-1)}-0.5)$ to $2^{(N-1)}-0.5$ with an average equal to 0. The result ranging from $-(2^{(N-1)}-0.5)$ to $2^{(N-1)}-0.5$ is provided to accumulator 606B (e.g., averaging circuit). For an averaging circuit implementation, Dout[N−1:0]−$(2^{(N-1)}-0.5)$ is accumulated for K times (where K is an integer (e.g., 5, 10, 20, 50, 100, etc.)). An average value is calculated as OS2_sign=Σ(Dout[N−1:0]−$(2^{(N-1)}-0.5)$)/K at output 622 in some embodiments. For an accumulator operation, Dout[N−1]−0.5 is continuously added and the accumulator output OS2_sign value equals an average value given by Σ(μ*(Dout[N−1:0]−$(2^{(N-1)}-0.5)$)), where μ is a coefficient that defines the accumulator bandwidth in some embodiments.

The OS2_sign value at output 622 is used to update the offset signal (e.g., offset command) for comparator 330B. When the OS2_sign value is greater than 0, comparator 330B (FIG. 3) has a positive DC offset. Accordingly, the offset signal (e.g., offset command) is updated by offset code calculation circuit 516B to reduce DC offset for comparator 330B. When OS1_sign value is less than 0, the comparator 330B has a negative DC offset. Accordingly, the offset signal (e.g., offset command) is updated by offset code calculation circuit 516B to increase the DC offset for comparator 330B. In some embodiments, adder 604B can be disposed between accumulator 606B and offset code calculation circuit 516B.

Figure 8:
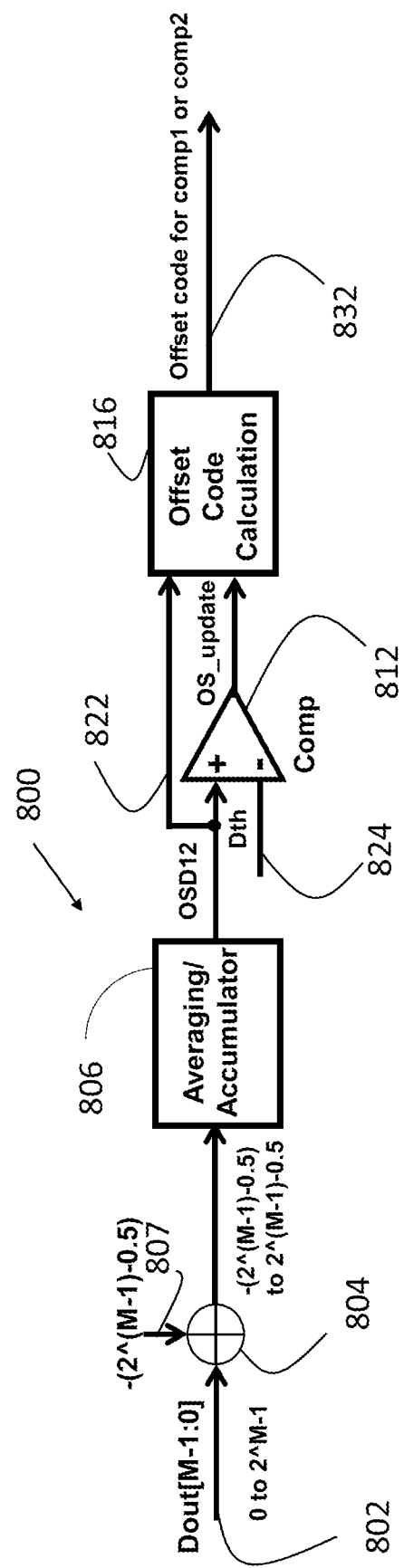
FIG. 8 is a block diagram of a portion of calibration engine illustrated in FIG. 5, according to one or more embodiments.

With reference to FIG. 8, a calibration engine 800 is configured as a DC offset calibration engine and receives the output data Dout[M−1:0] at input 802 from output ports 322 (FIG. 3) in some embodiments. Calibration engine 800 can be used as calibration engine 390 (FIG. 3). In some embodiments, calibration engine 800 and the scheme described below is used after DC offset calibration of comparator 330A, comparator 330B, or both comparators 330A and 330B (e.g. as described above with reference to FIGS. 5, 6, and 7).

Calibration engine 800 can employ an approach to calibrate the DC offset difference between comparators 330A and 330B in foreground or background and provide the offset correction codes for comparator 330A and/or comparator 330B at output 832 for reception at input 392A (FIG. 3) and for reception at input 392B, respectively. In some embodiments, comparator 330B (FIG. 3) generates last significant bits ([M−1:0] bits. Calibration engine 800 includes an adder, 804, an averaging circuit or accumulator 806, a comparator 812, and an offset code calculation circuit 816 and uses last significant bits ([M−1:0] bits to extract an offset difference between comparators 330A and 330B in some embodiments.

Accumulator 806 is coupled to offset code calculation circuit 816 and a noninverting input of comparator 812. The last bits of the data output Dout[M−1:0] are received as a value ranging from 0 to $2^{M-1}$ at input 802. The value of the bits of the data output Dout[M−1:0] is subtracted in adder 804 by a value $2^{(M-1)}-0.5$ provided at input 807 of adder 804. The result ranges from $-(2^{(M-1)}-0.5)$ to $2^{(M-1)}-0.5$ with an average equal to 0. The result ranging from $-(2^{-M-1}-0.5)$ to $2^{(M-1)}-0.5$ is provided to accumulator 806 (e.g., averaging circuit). For an averaging circuit implementation, Dout[M−1:0]−$(2^{(M-1)}-0.5)$ is accumulated for K times (where K is an integer (e.g., 5, 10, 20, 50, 100, etc.)). An average value is calculated as OSD12=Σ(Dout[M−1:0]−$(2^{(M-1)}-0.5)$)/K at output 822 in some embodiments. For an accumulator operation, Dout[M−1]−0.5 is continuously added and the accumulator output OSD12 value equals an average given by Σ(μ*(Dout[M−1:0]−$(2^{(M-1)}-0.5)$)), where μ is a coefficient that defines the accumulator bandwidth in some embodiments.

The amplitude of OSD12 is compared with a preset target threshold $D_{th}$ at an inverting input of comparator 652. If the absolute value of OSD12 (|OSD12|) is less than a threshold $D_{th}$, the DC offset difference between comparators 330A and 330B is small (e.g., less than hundreds of microvolts) and an update is not needed. The threshold $D_{th}$ can be a fixed value representing a minor or insignificant difference between the DC offset of comparator 330A and comparator 330B. If the absolute value of OSD12 is greater than the threshold $D_{th}$, the DC offset difference is too great and an offset code update is needed. Comparator 652 provides a control signal to offset code calculation circuit 816 indicating that an update is needed. If the value of OSD12 is greater than 0, the offset of comparator 330B is larger than the offset of comparator 330A and offset code calculation circuit increases the offset for comparator 330B or decreases the offset for comparator 330A. If the value of OSD12 is less than zero, the offset of comparator 330B is smaller than the offset of comparator 330A and offset code calculation circuit 816 decreases the offset for comparator 330B or increases the offset for comparator 330A. In some embodiments, adder 804 can be disposed between accumulator 806 and offset code calculation circuit 816.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A device, comprising:
   a sample and digital to analog conversion (DAC) circuit to sample an input voltage to obtain a first sampled voltage;
   a first comparator coupled to the sample and DAC circuit;
   a first set of storage circuits coupled to the first comparator and the sample and DAC circuit, the first set of storage circuits being configured to store a first subset of a plurality of bits corresponding to the input voltage;
   a second comparator coupled to the sample and DAC circuit;
   a second set of storage circuits coupled to the second comparator and the sample and DAC circuit, the second set of storage circuits being configured to store a second subset of the plurality of bits corresponding to the input voltage; and
   a calibration circuit configured to receive a first bit from a first storage unit of the first set of storage circuits and a number of bits from the first set of storage circuits and the second set of storage circuits, wherein the calibration circuit is configured to provide a first offset signal to control a first offset associated with the first comparator and a second offset signal to control a second offset associated with the second comparator.

2. The device of claim 1, wherein the first comparator has a faster detection speed than the second comparator, wherein the second comparator has a higher sensitivity than the first comparator.

3. The device of claim 1, wherein the first bit is a most significant bit.

4. The device of claim 1, wherein the number of bits includes all of the bits of the first set of storage circuits and the second set of storage circuits.

5. The device of claim 1, wherein the calibration circuit comprises a first averaging circuit configured to receive the first bit and a second averaging circuit configured to receive the number of bits.

6. The device of claim 5, wherein a first offset code calculation circuit is coupled to the first averaging circuit and a second offset code calculation circuit is coupled to the second averaging circuit.

7. The device of claim 5, wherein the first averaging circuit is an accumulator.

8. The device of claim 1, wherein the device is disposed in an integrated circuit package.

9. The device of claim 1, wherein an output of the first comparator is directly coupled to input ports of the first set of storage circuits, wherein an output of the second comparator is directly coupled to input ports of the second set of storage circuits.

10. A device, comprising:
    a sample and digital to analog conversion (DAC) circuit to sample an input voltage to obtain a first sampled voltage;
    a first comparator coupled to the sample and DAC circuit;
    a first set of storage circuits coupled to the first comparator and the sample and DAC circuit, the first set of storage circuits being configured to store a first subset of a plurality of bits corresponding to the input voltage;
    a second comparator coupled to the sample and DAC circuit;
    a second set of storage circuits coupled to the second comparator and the sample and DAC circuit, the second set of storage circuits being configured to store a second subset of the plurality of bits corresponding to the input voltage; and
    a calibration circuit configured to receive the second subset of the plurality of bits corresponding to the input voltage and to accumulate or average the second subset of the plurality of bits corresponding to the input voltage, wherein the calibration circuit is configured to provide a first offset signal to control a first offset associated with the first comparator or a second offset signal to control a second offset associated with the second comparator, wherein the calibration circuit is configured to update the first offset signal or the second offset signal when an average of the second subset of the plurality of bits is above a threshold.

11. The device of claim 10, wherein the first comparator has a faster detection speed than the second comparator, wherein the second comparator has a higher sensitivity than the first comparator.

12. The device of claim 10, wherein the calibration circuit comprises a third comparator, the third comparator receiving the average and the threshold.

13. The device of claim 10, wherein the second subset of the bits includes all of the bits of the second set of storage circuits.

14. The device of claim 10, wherein the calibration circuit comprises an adder.

15. The device of claim 10, wherein the device is disposed in an integrated circuit package.

16. A method comprising:
    sampling, by a sample and digital to analog conversion (DAC) circuit, an input voltage to obtain a first sampled voltage;
    determining, by a first comparator coupled to a first set of storage circuits, a state of a first bit of a plurality of bits corresponding to the input voltage, according to the first sampled voltage;

sampling, by the sample and DAC circuit, the input voltage to obtain a second sampled voltage;

determining, by a second comparator coupled to a second set of storage circuits different from the first set of storage circuits, a state of a second bit of the plurality of bits, according to the second sampled voltage;

averaging a first number of the plurality of bits from the first set of storage circuits and a second number of bits from the first set of storage circuits and the second set of storage circuits; and providing a first offset signal in response to an average of the first number of the bits to control a first offset associated with the first comparator and a second offset signal in response to the second number of the bits to control a second offset associated with the second comparator to reduce an offset difference.

17. The method of claim 16, wherein the first number of the bits is a most significant bit.

18. The method of claim 17, wherein the second number of the bits includes all of the bits of the first set of storage circuits and the second set of storage circuits.

19. The method of claim 17, further comprising:

storing, by a corresponding one of the first set of storage circuits, a determined state of the first bit; and storing, by a corresponding one of the second set of storage circuits, a determined state of the second bit.

20. The method of claim 19, wherein sampling, by the sample and DAC circuit, the input voltage to obtain the second sampled voltage is based at least in part on the determined state of the first bit stored by the corresponding one of the first set of storage circuits.

* * * * *